United States Patent [19]

Long

[11] Patent Number: 5,206,794
[45] Date of Patent: Apr. 27, 1993

[54] INTEGRATED CIRCUIT PACKAGE WITH DEVICE AND WIRE COAT ASSEMBLY

[75] Inventor: Jon M. Long, Livermore, Calif.

[73] Assignee: VLSI Technology, Inc., San Jose, Calif.

[21] Appl. No.: 811,406

[22] Filed: Dec. 20, 1991

[51] Int. Cl.$^5$ .............................................. H05K 7/20
[52] U.S. Cl. .................................. 257/675; 174/52.2; 361/388; 361/421; 361/386; 257/688; 437/220
[58] Field of Search .................... 174/52.2; 357/70, 72, 357/81; 361/386–389, 398, 408, 421

[56] References Cited

U.S. PATENT DOCUMENTS

| | | | |
|---|---|---|---|
| 3,706,840 | 12/1972 | Moyle et al. | 174/52.2 |
| 3,839,660 | 10/1974 | Stryker | 174/52.2 |
| 4,827,328 | 5/1989 | Ozawa et al. | 174/52.2 |
| 4,974,057 | 11/1990 | Tazima | 174/52.2 |
| 5,065,281 | 11/1991 | Hernandez et al. | 361/421 |

*Primary Examiner*—Gregory D. Thompson
*Attorney, Agent, or Firm*—Majestic, Parsons, Siebert & Hsue

[57] ABSTRACT

A molded, plastic integrated circuit package is formed wherein a silicone compound is first applied over the exposed surface of the integrated circuit, its bonding wires, and portions of the lead frame including those portions where the bonding wires are attached. Following application of the silicone compound and before molding in plastic, the silicone compound is cured to set and harden the material. With the bonding wires and bonding points thus encapsulated by the silicone compound, the bonding wires are protected from lateral bending forces caused by viscous forces during the process of forming the molded plastic package, and from longitudinal expansion and contraction forces during thermal temperature cycling of the package.

18 Claims, 3 Drawing Sheets

INTEGRATED CIRCUIT PACKAGE WITH DEVICE AND WIRE COAT ASSEMBLY

BACKGROUND OF THE INVENTION

This invention relates in general to integrated circuit packages and in particular, to a double encapsulation structure and method wherein a protective material is applied over a die, a portion of a lead frame and connecting bonding wires to form a first encapsulation structure which is in turn, encapsulated in an integrated circuit molded package.

One means of packaging an integrated circuit ("IC") is to encapsulate the IC in a plastic material. For example, in a plastic leaded chip carrier ("PLCC") package, the IC is electrically connected to an alloy 42 or copper lead frame by bonding wires and subsequently, the IC, bonding wires and portions of the lead frame are encapsulated by transfer molding techniques using a mold and a thermal set epoxy plastic. The resulting molded, plastic package is popular for commercial applications, because it is rugged, inexpensive and suitable for large scale production.

Reliability problems, however, can result from the fabrication process for molded, plastic IC packages. First, the bonding wires can be bent by an action referred to as "wire sweep." Wire sweep occurs when the bonding wires are laterally bent by viscous forces caused by the motion of the plastic material when it is being injected by a plunger into the IC package mold.

Wire sweep can result in two reliability problems. One problem is that adjacent wires may be bent towards each other in such a way as to cause the two wires to short. The second is that wire sweep causes longitudinal stress on the wire bonding points on both the IC and the lead frame, thus causing the bonding wires to pull away and potentially break electrical contact.

Differences in the thermal coefficients of expansion of the plastic molding compound and other parts of the packaged device can also result in reliability problems. For example, exposure to heat can cause the plastic compound to expand resulting in longitudinal forces pulling the bonding wires away from their bonding points on both the IC and the lead frame, thus potentially causing electrical contact breaks.

FIG. 1A illustrates a cross-sectional view of a typical PLCC wherein longitudinal forces 22 around radial axis 12 are caused by the plastic material 90 expanding. The longitudinal forces 22 pull on bonding wires 20 which are connected at one end to an IC 10 sitting on pad 30 and at the opposite end to a lead frame 40 at bonding points 24 and 26, respectively. Clearly, if the longitudinal forces 22 are sufficiently strong enough, the bonding wires 20 could break physical and electrical contact with either or both the IC 10 and lead frame 40 at the bonding points 24 and 26.

Conversely, exposure to cold can cause the plastic material to contract resulting in longitudinal forces pushing down on both the bonding wires and the IC surface, thus potentially causing fractures at both the bonding points and the IC surface. FIG. 1B illustrates a cross-sectional view of a typical PLCC wherein longitudinal forces 28 around radial axis 12 are caused by the plastic material 90 Contracting. The longitudinal forces 28 push down on bonding wires 20 which are connected at one end to the IC 10 sitting on pad 30 and at the opposite end to the lead frame 40 at bonding points 24 and 26, respectively.

If the longitudinal forces 28 are sufficiently strong, the bonding wires 20 could bend causing shearing forces 27 at bonding points 24 and 26. These shearing forces 27, in turn, could cause the bonding wires 20 to break physical and electrical contact with either or both the IC 10 and lead frame 40 at the bonding points 24 and 26. Additionally, if the longitudinal forces 28 are sufficiently strong enough, fractures could occur on the die surface 25 or at bonding points 24 and 26.

Prior attempts to alleviate these reliability problems associated with molded, plastic IC packages have not been entirely successful, and suggest even less promise for solving the reliability problems associated with the higher density ICs of the future. For example, to alleviate the problem of wire sweep, attempts have been made to use less viscous plastic molding compounds. Although these compounds reduce the viscous forces acting against the bonding wires when the compound is injected into the plastic IC package mold, they prove inadequate to reliably solve the increasing sensitivity to wire sweep caused by advances in IC technology such as decreases in the dimensions of ICs and increases in the required number of bonding wires.

Attempts to alleviate problems associated with differences in thermal coefficients of expansion between the plastic compound and other parts of the package device have also been less than entirely satisfactory. For example, the IC die surface has been coated with various materials to act as shock absorbers against the longitudinal forces pushing down on the die surface as a result of the plastic compound contracting from exposure to cold. The die surface coating, however, does not protect the bonding wires from longitudinal forces caused by the plastic compound either expanding or contracting. Thus, reliability problems still persist whereby the bonding wires may be pulled away from their bonding points on both the IC and the lead frame, thus causing electrical contact breaks, or the bonding wires may be pushed down onto their bonding points, thus causing fractures at these points.

SUMMARY OF THE INVENTION

Accordingly, one object of the present invention is to eliminate wire sweep problems caused when fabricating molded, plastic IC packages.

Another object is to reduce longitudinal stresses on the IC surface, bonding wires and bonding points that are caused by differences in the thermal coefficients of expansion between the plastic molding compound and other parts of the packaged device.

Another object is to increase the reliability of molded, plastic IC packages when subjected to various thermal conditions.

These and additional objects are accomplished by the various aspects of the present invention. One aspect of the invention accomplishes one or more of these objects by forming a protective encapsulation around the IC and its bonding wires prior to forming the molded, plastic IC package body. Briefly stated, the structure and method of this aspect of the invention comprises a double encapsulation to protect the IC and a method of forming the double encapsulation. The first encapsulation covers the exposed surface of the IC, the bonding wires of the IC, and the respective bonding points of the bonding wires to both the IC and a lead frame with a selected material before the plastic molding process of the IC package. The second encapsulation is the plastic molding of the IC package body.

The problem of wire sweep is thus eliminated, because the protective encapsulation protects the bonding wires from the viscous force caused by the motion of the plastic material when it is being injected by the plunger into the IC package mold. The protective encapsulation does not cause wire sweep, because it is applied by conventional methods which exert minimal force against the bonding wires.

The problems resulting from differences between the thermal coefficients of expansion of the plastic molding compound and other parts of the packaged device are also minimized by the dual encapsulation structure and method. As will be described, counteracting forces between the two encapsulation materials at their interface surface serve to minimize the effect of longitudinal forces caused by the expansion or contraction of the encapsulation materials on the IC surface, the bonding wires and the bonding points of the bonding wires on the IC and lead frame.

The structure and process of this aspect of the present invention are also compatible with standard, commercially available lead frames and plastic transfer molding processes. In the preferred embodiment, the die attach pad of the conventional lead frame serves as heat sink and mechanical support to the integrated circuit die, and a simple taping structure is used to provide additional mechanical support and a support base for the first encapsulating material. Following encapsulation of the IC surface, the bonding wires and the bonding points, the encapsulated structure is then processed by conventional means to form the completed molded IC package.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1A:
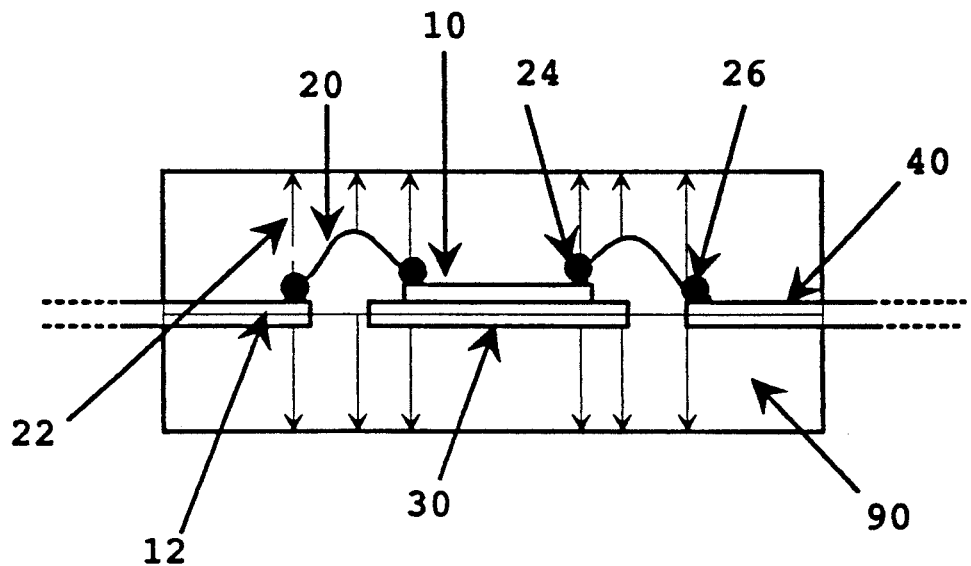
FIG. 1A illustrates a cross-sectional view of a typical plastic, leaded chip carrier package with the plastic mold material expanding in response to heat.
Figure 1B:
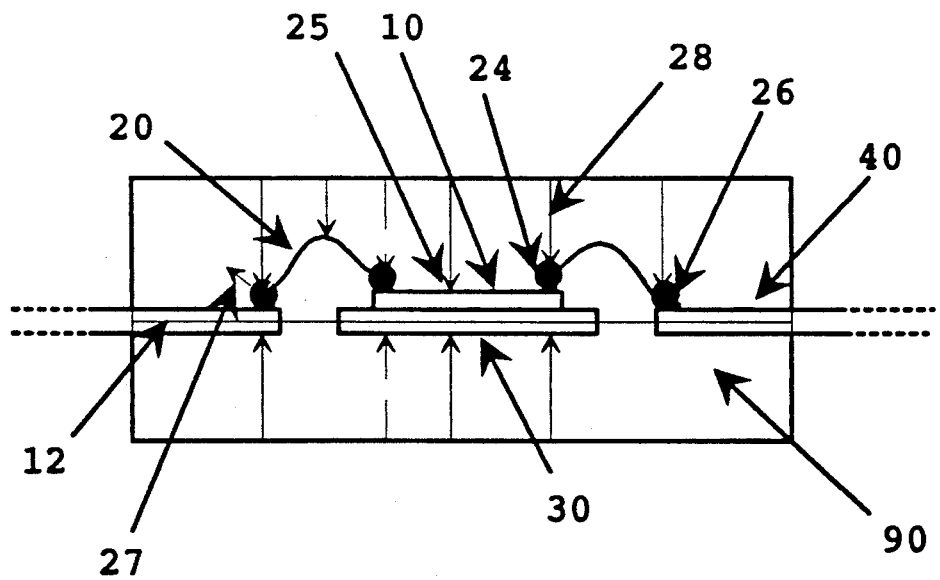
FIG. 1B illustrates a cross-sectional view of a typical plastic, leaded chip carrier package with the plastic mold material contracting in response to cold.
Figure 2A:
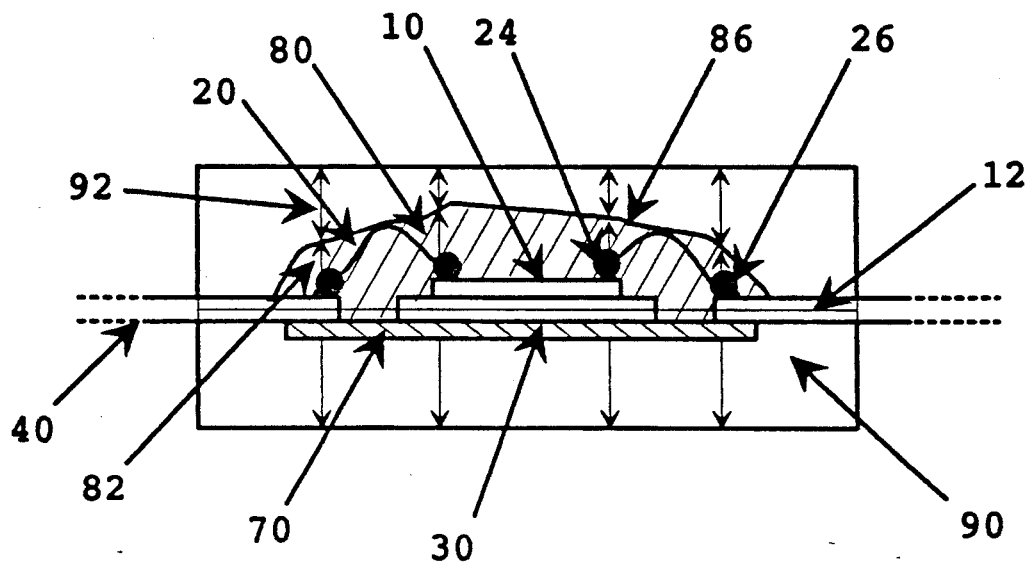
FIG. 2A illustrates a cross-sectional view of a plastic, leaded chip carrier package utilizing aspects of the present invention, with the plastic mold material and inner, protective encapsulation material expanding in response to heat.

FIG. 2A illustrates a cross-sectional view of a plastic, leaded chip carrier ("PLCC") package utilizing aspects of the present invention. An IC 10 is electrically connected to a lead frame 40 by bonding wires 20 at bonding points 24 and 26. The IC 10 further sits on a die attach pad 30 which is mechanically connected to the lead frame 40 by an adhesive tape 70.

The tape 70 also serves as a base support for a layer of material 80 (shaded region) which is applied to sufficient breadth and height as to completely cover the bonding wires 20, the exposed surface of the IC 10, and the bonding points 24 and 26 of the bonding wire 20 to the IC 10 and lead frame 40, respectively. In the preferred embodiment, the material 80 is a silicone compound which is applied over the appropriate areas by conventional means that exert minimal force on the bonding wires and their respective bonding points. Once applied, the silicone compound is typically cured in order to harden and set the material.

A conventional transfer molding process utilizing a package body mold (not shown), is then performed on the thus encapsulated structure in order to form the plastic region 90 which completes the molded, plastic IC package. Interaction between the encapsulated regions 80 and 90, respectively, then serve to reduce any damaging longitudinal forces on the bonding wires 20 or their bonding points 24 and 26.

When the molded, plastic IC package is subjected to heat, longitudinal expansion forces 92 and 82 are generated in the plastic 90 and silicone 80 regions, respectively. Although the longitudinal forces 82 act to pull on bonding wires 20, the strength of these forces are substantially diminished by counteracting forces 92 from the expanding plastic 90 at the plastic/silicone interface surface 86. In addition, even though expansion of the silicone compound 80 will subject the bonding wires 20 and their bonding points 24 and 26 to the IC and lead frame, respectively, to the longitudinal forces 82, the silicone compound 80 typically has a lower coefficient of expansion than the plastic 90, which also serves to reduce the longitudinal forces pulling on bonding wires 20 as compared to the conventional molded, plastic IC package.

Figure 2B:
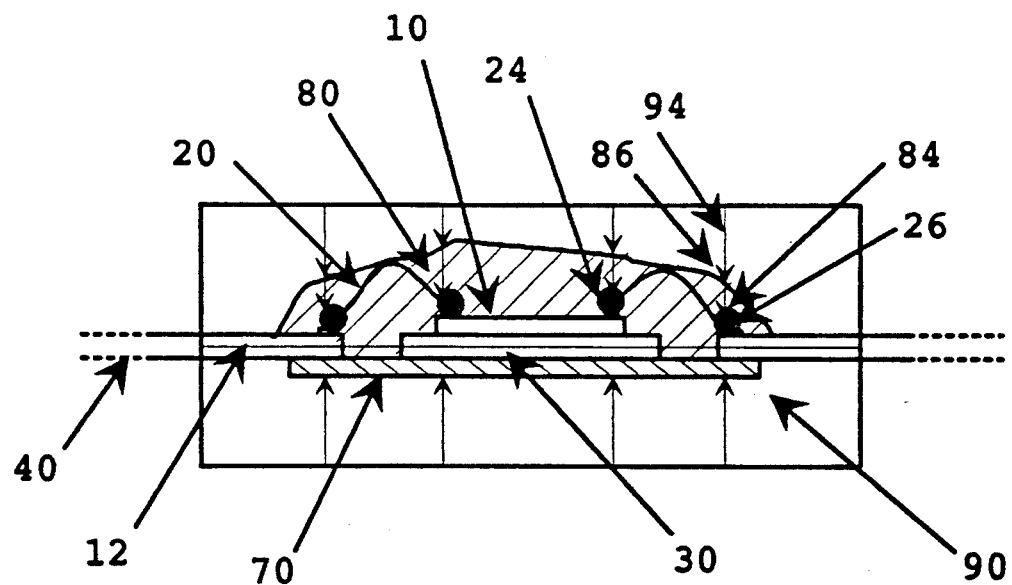
FIG. 2B illustrates a cross-sectional view of a plastic, leaded chip carrier package utilizing aspects of the present invention, with the plastic mold material and inner, protective encapsulation material contracting in response to cold.

FIG. 2B illustrates a cross-sectional view of the same PLCC package as that illustrated in FIG. 2A, except that in this case, the package is exposed to cold instead of heat. As a result of exposure to the cold temperature, longitudinal contraction forces 94 and 84 are generated in the plastic 90 and silicone 80 regions, respectively. The resulting longitudinal forces 84 pushing down on the bonding wires 20 and bonding points 24 and 26 are less than those of the conventional molded, plastic IC package, primarily because the thermal coefficient of expansion of the silicone compound is less than that of plastic material, thus resulting in smaller longitudinal forces 84 pushing down on these items. In addition, the silicone compound 80 acts as a shock absorber against the larger longitudinal contraction forces 94 from the plastic material 90.

Although the various aspects of the present invention have been described with respect to a preferred embodiment, it will be understood that the invention is entitled to full protection within the full scope of the appended claims. For example, FIGS. 3 and 4 illustrate alternative embodiments utilizing aspects of the present invention.

Figure 3:
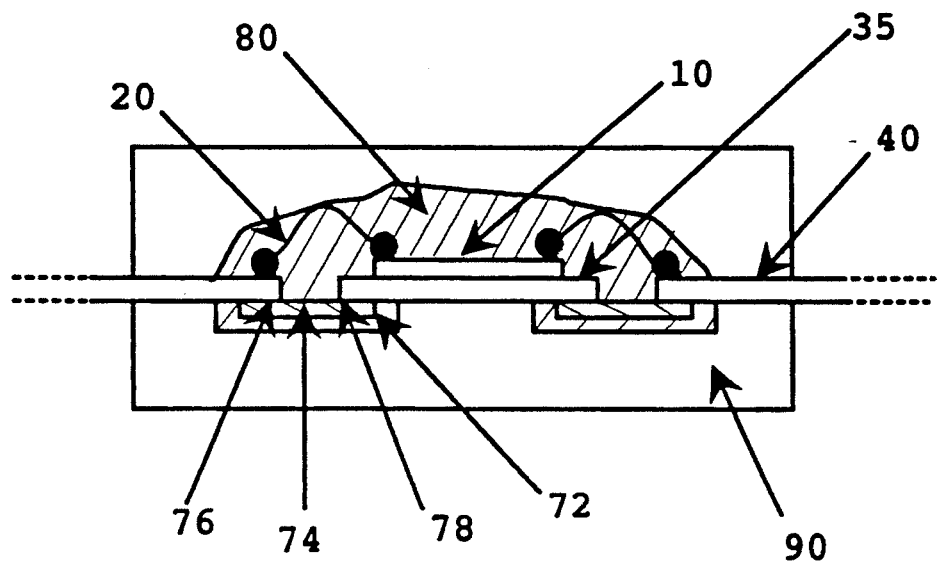
FIG. 3 illustrates an alternative embodiment utilizing aspects of the present invention.

FIG. 3 illustrates an alternative structure for forming the base support to the layer of material 80. Forming the support is a heat conductive backing 35 which is attached to the lead frame 40 at location 76 by one or more adhesive, polyimide tapes 72, or other means, and to which is attached the IC 10 at location 78.

The conductive backing 35 could either be the die attach pad 30 (FIG. 2A) or other heat conductive material such as a heat conductive tape. Additionally, the tape 72 could have conductive strips 74 which thermally connect location 78 to location 76 in order to dissipate heat away from the IC 10.

Figure 4:
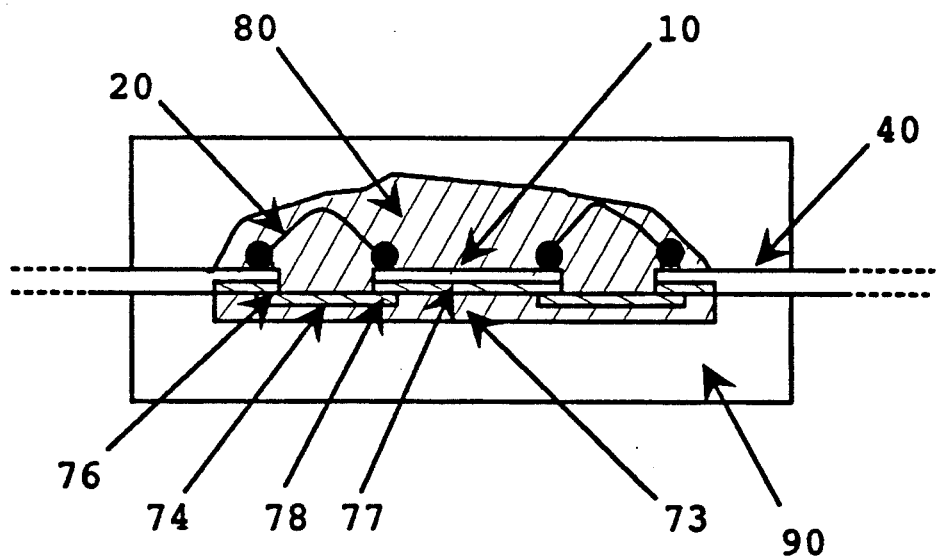
FIG. 4 illustrates a second alternative embodiment utilizing aspects of the present invention.

FIG. 4 illustrates another alternative structure for forming the base support to the layer of material 80. In this embodiment, forming the support is a single piece of heat conductive tape 73 which is attached by an adhesive 77 or other means, to the lead frame 40 at location 76 and to which is attached the IC 10 at location 78. Typically, the heat conductive tape may be formed by having conductive strips 74 of copper or gold-plated copper preformed on the tape surface that extend from at least location 78 to location 76 in order to dissipate heat away from the IC 10.

In addition to the alternative embodiments shown, other embodiments are readily ascertainable utilizing aspects of the present invention, and are understood to be within the full scope of the appended claims.

What is claimed is:

1. An integrated circuit package comprising:
   an integrated circuit die,
   a lead frame,
   at least one bonding wire having one end attached to said integrated circuit die and an opposite end attached to said lead frame,
   a heat conductive tape having a surface with a heat conductive strip, said surface having first and second locations, said heat conductive strip being thermally connected to said first and second locations,
   means for attaching said heat conductive tape to said integrated circuit die at said first location and to said lead frame at said second location,
   a layer of a first encapsulating material contacting and covering said integrated circuit die and said at least one bonding wire including its attachment points to said integrated circuit die and said lead frame, and
   a layer of a second encapsulating material contacting and covering said layer of first encapsulating material,
   wherein said heat conductive tape acts as a support base for said layer of first encapsulating material.

2. The integrated circuit package as recited in claim 1 wherein said first encapsulating material comprises a silicone compound.

3. The integrated circuit package as recited in claim 1 wherein said second encapsulating material comprises a plastic epoxy material.

4. The integrated circuit package as recited in claim 1 wherein said first encapsulating material has a lower thermal coefficient of expansion than said second encapsulating material.

5. The integrated circuit package as recited in claim 1 wherein said at least one heat conductive strip of said heat conductive tape comprises copper.

6. The integrated circuit package as recited in claim 1 wherein said at least one heat conductive strip of said heat conductive tape comprises gold-plated copper.

7. The integrated circuit package as recited in claim 1 wherein said attaching means comprises an adhesive material.

8. The integrated circuit package as recited in claim 1 wherein said heat conductive tape comprises a polyimide material.

9. A method of packaging an integrated circuit die, a portion of a lead frame, and at least one bonding wire which is attached to said die at one end and said lead frame at an opposite end, comprising the steps of:
   forming a heat conductive tape having a heat conductive strip,
   attaching said heat conductive tape to said integrated circuit die and to said lead frame in such a fashion that said heat conductive strip thermally connects said integrated circuit die to said lead frame,
   forming a first encapsulation layer on said heat conductive tape such that said layer contacts and covers said at least one bonding wire, and
   forming a second encapsulation layer which contacts and covers said first encapsulation layer.

10. The method as recited in claim 9 wherein said first encapsulation layer forming step includes depositing a silicone compound on said heat conductive tape.

11. The method as recited in claim 10 wherein said first encapsulation layer forming step further comprises the step of curing said deposited silicone compound.

12. The method as recited in claim 9 wherein said second encapsulation layer forming step further comprises the steps of:
   placing said first encapsulation layer, aid at least one bonding wire, said die, said heat conductive tape, and said portion of said lead frame into a mold, and
   forming a plastic package which covers said first encapsulation layer, said at least one bonding wire, said die, said heat conductive tape, and said portion of said lead frame.

13. An integrated circuit package comprising:
   an integrated circuit die,
   a lead frame,
   at least one bonding wire having one end attached to said integrated circuit die and an opposite end attached to said lead frame,
   a heat conductive backing having a top and bottom surface, said integrated circuit die being attached to said top surface,
   an adhesive tape having a surface with a heat conductive strip, said surface having first and second locations, said heat conductive strip being thermally connected to said first and second locations, said adhesive tape being attached to said lead frame at said first location and being attached to said heat conductive backing at said second location,
   a layer of a first encapsulating material contacting and covering said integrated circuit die and said at least one bonding wire including its attachment points to said integrated circuit die and said lead frame, and
   a layer of a second encapsulating material contacting and covering said layer of first encapsulating material,
   wherein said adhesive tape acts as a support base for said layer of first encapsulating material.

14. The integrated circuit package as recited in claim 13 wherein said heat conductive backing comprises a die attach pad.

15. The integrated circuit package as recited in claim 13 wherein said heat conductive backing comprises a conductive tape.

16. The integrated circuit package as recited in claim 13 wherein said adhesive tape comprises a polyimide material.

17. The integrated circuit package as recited in claim 13 wherein said heat conductive strip comprises copper.

18. The integrated circuit package as recited in claim 13 wherein said heat conductive strip comprises gold-plated copper.

* * * * *